US006982908B2

(12) United States Patent
Cho

(10) Patent No.: US 6,982,908 B2
(45) Date of Patent: Jan. 3, 2006

(54) MAGNETIC RANDOM ACCESS MEMORY DEVICE CAPABLE OF PROVIDING A CONSTANT CURRENT TO A REFERENCE CELL

(75) Inventor: Woo Yeong Cho, Suwon (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/625,025

(22) Filed: Jul. 22, 2003

(65) Prior Publication Data

US 2004/0022097 A1 Feb. 5, 2004

(30) Foreign Application Priority Data

Aug. 2, 2002 (KR) ...................... 10-2002-0045784

(51) Int. Cl.
*G11C 11/14* (2006.01)
*G11C 11/15* (2006.01)
*G11C 7/14* (2006.01)

(52) U.S. Cl. ................. 365/189.06; 365/158; 365/171; 365/173; 365/210

(58) Field of Classification Search ........... 365/185.21, 365/158, 185.2, 207, 157, 205, 200, 210, 365/189.06, 189.09, 189.01, 230.03, 189.07, 365/189.08, 185.14, 171, 173
See application file for complete search history.

(56) References Cited

U.S. PATENT DOCUMENTS

| | | | | |
|---|---|---|---|---|
| 5,936,906 A * | 8/1999 | Tsen | ........................... | 365/210 |
| 6,278,631 B1 | 8/2001 | Naji | ........................... | 365/158 |
| 6,418,046 B1 * | 7/2002 | Naji | ........................... | 365/158 |
| 6,445,612 B1 * | 9/2002 | Naji | ........................... | 365/158 |
| 6,600,690 B1 * | 7/2003 | Nahas et al. | ................. | 365/210 |
| 6,639,849 B2 * | 10/2003 | Takahashi et al. | ..... | 365/189.07 |
| 6,700,814 B1 * | 3/2004 | Nahas et al. | ................. | 365/158 |
| 6,788,568 B2 * | 9/2004 | Hidaka | ........................ | 365/158 |
| 6,791,890 B2 * | 9/2004 | Ooishi | ........................ | 365/201 |
| 6,799,256 B2 * | 9/2004 | Van Buskirk et al. | ...... | 711/156 |
| 2001/0053104 A1 * | 12/2001 | Tran et al. | ................... | 365/210 |
| 2003/0179602 A1 * | 9/2003 | Lee et al. | .................... | 365/158 |
| 2004/0012995 A1 * | 1/2004 | Ishikawa | .................... | 365/158 |
| 2004/0076029 A1 * | 4/2004 | Jeong | .......................... | 365/50 |

* cited by examiner

*Primary Examiner*—Richard Elms
*Assistant Examiner*—Dang Nguyen
(74) *Attorney, Agent, or Firm*—F. Chau & Associates LLC

(57) ABSTRACT

A magnetic random access memory (MRAM) includes a first memory array having a plurality of first memory cells, wherein each one of the plurality of first memory cells is arranged at an intersection of at least one of a plurality of wordlines, at least one of a plurality of bitlines, and at least one of a plurality of digit lines, a second memory array having a plurality of second memory cells, wherein each one of the plurality of second memory cells is arranged at an intersection of at least one of the plurality of wordlines, at least one of a first bitline and a second bitline, and at least one of the plurality of digit lines, a current providing unit for providing a second current to one of the first bitline and the second bitline in response to a reference voltage, and a sense amplifier for comparing a first current flowing through one of the plurality of bitlines with the second current. A constant current flows to a reference data line without adjusting a level of the reference voltage. Therefore, it is possible to efficiently and accurately sense current of a bitline and determine a logic state of a selected memory cell.

18 Claims, 5 Drawing Sheets

MAGNETIC RANDOM ACCESS MEMORY DEVICE CAPABLE OF PROVIDING A CONSTANT CURRENT TO A REFERENCE CELL

FIELD OF THE INVENTION

The present invention relates to a magnetic random access memory device and, more particularly, to a magnetic random access memory device capable of providing a constant current to a reference cell.

BACKGROUND OF THE INVENTION

A magnetic random access memory ("MRAM") device is a kind of a non-volatile memory device, which includes a plurality of magnetic memory cells. MRAM uses magnetic charges to store bits of data. In general, the structure of an MRAM device includes, memory cells having non-magnetic film and magnetic film alternately stacked. For example, a memory cell of an MRAM device may include an insulating film interposed between two magnetic films. The memory cell is written by changing the magnetization direction (i.e., polarity) of one of the magnetic films. The change in polarity results in a considerable change in resistance, which is known as the giant magnetoresistive effect ("GMR"). The overall resistance of the magnetic memory cell has a maximum value or a minimum value according to magnetization directions of the magnetic film. For example, if the magnetic directions of the magnetic films are identical with each other, (i.e., a "parallel" state), an overall resistance is relatively low. In the parallel state, the memory cell is clear (e.g. "0") and considered to be in a logic low ("L") state. In contrast, if the magnetic directions are adverse to each other, (i.e., an "anti-parallel" state), an overall resistance is relatively high. In the anti-parallel state, the memory cell is holding data (e.g. "1") and considered to be in a logic high ("H") state.

To read the logic state of a magnetic memory cell, the MRAM device applies a sense current and a reference current to a target cell and a reference cell, respectively. A voltage drop occurs at both ends of the target cell and the reference cell depending on the respective resistance values of the cells. The voltages of the cells are compared with each other to determine a logic state of the target cell. FIG. 1 shows a conventional 32Kb MRAM memory block including a midpoint reference generator therein. FIG. 1 originates from FIG. 7 of a paper reporting the demonstration of MRAM from the 2002 VLSI Symposia on Technology and Circuits.

Referring to FIG. 1, the midpoint reference generator has four magnetic resistors that are connected in series and parallel. A serially-connected resistor is connected to another serially-connected resistor in parallel resulting in a resistor having a value equal to (Rmax+Rmin)/2. The resistance (Rmax+Rmin)/2 represents a reference resistance that is halfway between the value of a resistance in a logic low (L) state and a logic high (H) state. A problem exists in that the resistance of the midpoint reference generator varies with the level of a bitline clamp voltage (reference voltage) Vref.

Referring to FIG. 2, a difference between a maximum resistor value Rmax and a minimum resistor value Rmin, when the bitline clamp voltage Vref is equal to a set value, is less than a difference therebetween when the bitline clamp voltage Vref is less than the set value. That is, when the level of the bitline clamp voltage Vref is high, a value of the resistor (Rmax+Rmin)/2 is low. In contrast, when the level of the bitline clamp voltage Vref is low, the value of the resistor (Rmax+Rmin)/2 is high. Accordingly, the midpoint reference generator must control the bitline clamp voltage Vref to maintain the desired value of the resistor (Rmax+Rmin)/2. However, the desired bitline clamp voltage can be attained only by trial and error. Further, restructuring of a bitline clamp voltage of the reference cell is considerably troublesome. Therefore, in order to precisely compare a target cell with a reference cell, there is a need for an MRAM device that produces a constant reference output regardless of changes in bitline clamp voltage.

SUMMARY OF THE INVENTION

In view of the foregoing, a memory device, in accordance with the present invention outputs a constant reference current to a reference cell irrespective of a bitline clamp voltage.

A memory device, in accordance with the present invention, includes a first memory array having a plurality of memory cells, wherein each one of the plurality of first memory cells is arranged at an intersection of at least one of a plurality of wordlines, at least one of a plurality of bitlines, and at least one of a plurality of digit lines, a second memory array having a plurality of second memory cells, wherein each one of the plurality of second memory cells is arranged at an intersection of at least one of the plurality of wordlines, at least one of a first bitline and a second bitline, and at least one of the plurality of digit lines, a current providing unit for providing a second current to one of the first bitline and the second bitline in response to a reference voltage, and a sense amplifier for comparing a first current flowing through one of the plurality of bitlines with the second current.

In alternate embodiments, a current providing unit may include a first current mirror coupled to the first bitline, wherein a current from the first bitline flows through the first current mirror in response to the reference voltage, a second current mirror coupled to the second bitline, wherein a current from the second bitline flows through the second current mirror in response to the reference voltage, and a third current mirror for providing half of the sum of the current from the first bitline and the current from the second bitline to the sense amplifier. Each one of the plurality of second memory cells may be set to a first logic state and coupled to the first bitline or set to a second logic state and coupled to the second bitline. The memory device may further include a clamp circuit for clamping down a voltage of a data line through which the first current is transmitted, and a voltage of a data line through which the second current is transmitted, to the reference voltage when one of the plurality of wordlines of one of the plurality of first memory cells is enabled. The first memory cells and the second memory cells may be magnetic. The second current may be a reference current defined by the expression (i(H)+i(L))/2. The first current may be a target current. The first current may be compared to the second current to determine a logic state of a predetermined one of the plurality of first memory cells.

Another memory device, in accordance with the present invention, includes a plurality of first bitlines and a plurality of second bitlines, a first memory array having a plurality of first memory cells, a second memory array having a plurality of second memory cells, a current providing unit for providing a second current to one of the plurality of second bitlines in response to a reference voltage, and a sense amplifier for comparing a first current flowing through one of the plurality of first bitlines with the second current.

In alternate embodiments, the current providing unit may include a first current mirror coupled to a first one of the plurality of second bitlines, a second current mirror coupled to a second one of the plurality of second bitlines, and a third current mirror for providing half of the sum of a current from the first current mirror and a current from the second current mirror to the sense amplifier. Each one of the plurality of second memory cells may be set to a first logic state and coupled to a first one of the plurality of second bitlines or set to a second logic state and coupled to a second one of the plurality of second bitlines. The memory device may further include a circuit for clamping down a voltage of a line through which the first current is transmitted, and a voltage of a line through which the second current is transmitted, to the reference voltage. The first memory cells and the second memory cells may be magnetic. The second current may be a reference current defined by the expression (i(H)+i(L))/2. The first current may be a target current. The first current may be compared to the second current to determine a logic state of a predetermined one of the plurality of first memory cells.

BRIEF DESCRIPTION OF THE DRAWINGS

Preferred embodiments of the invention can be understood in more detail from the following descriptions taken in conjunction with the accompanying drawings in which.

DETAILED DESCRIPTION OF PREFERRED EMBODIMENTS

Preferred embodiments of the present invention will now be described more fully hereinafter below in more detail with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

An MRAM according to the present invention is now described below with reference to FIG. 3.

Figure 1:
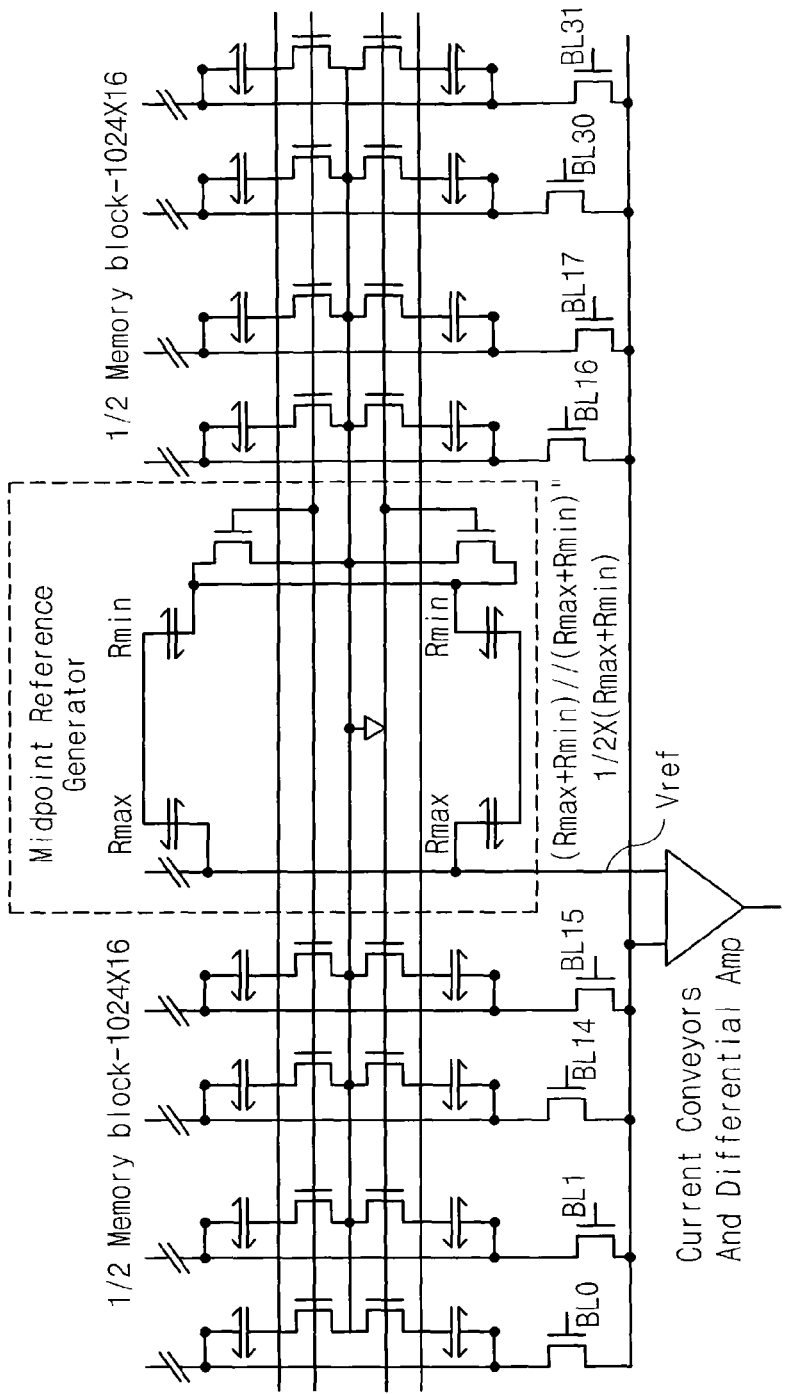
FIG. 1 shows a conventional MRAM device.
Figure 2:
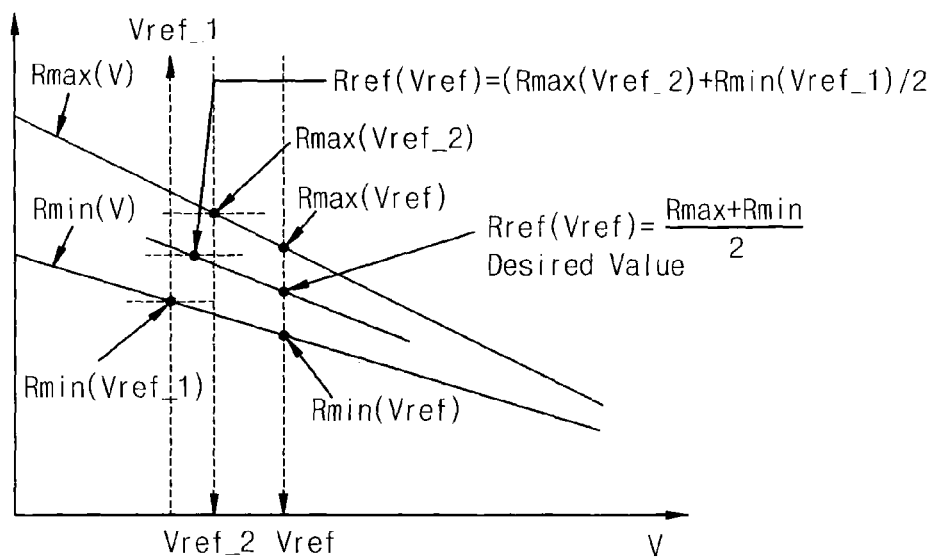
FIG. 2 shows variations in reference resistance based on bitline clamp voltage of the midpoint reference generator shown in FIG. 1.
Figure 3:
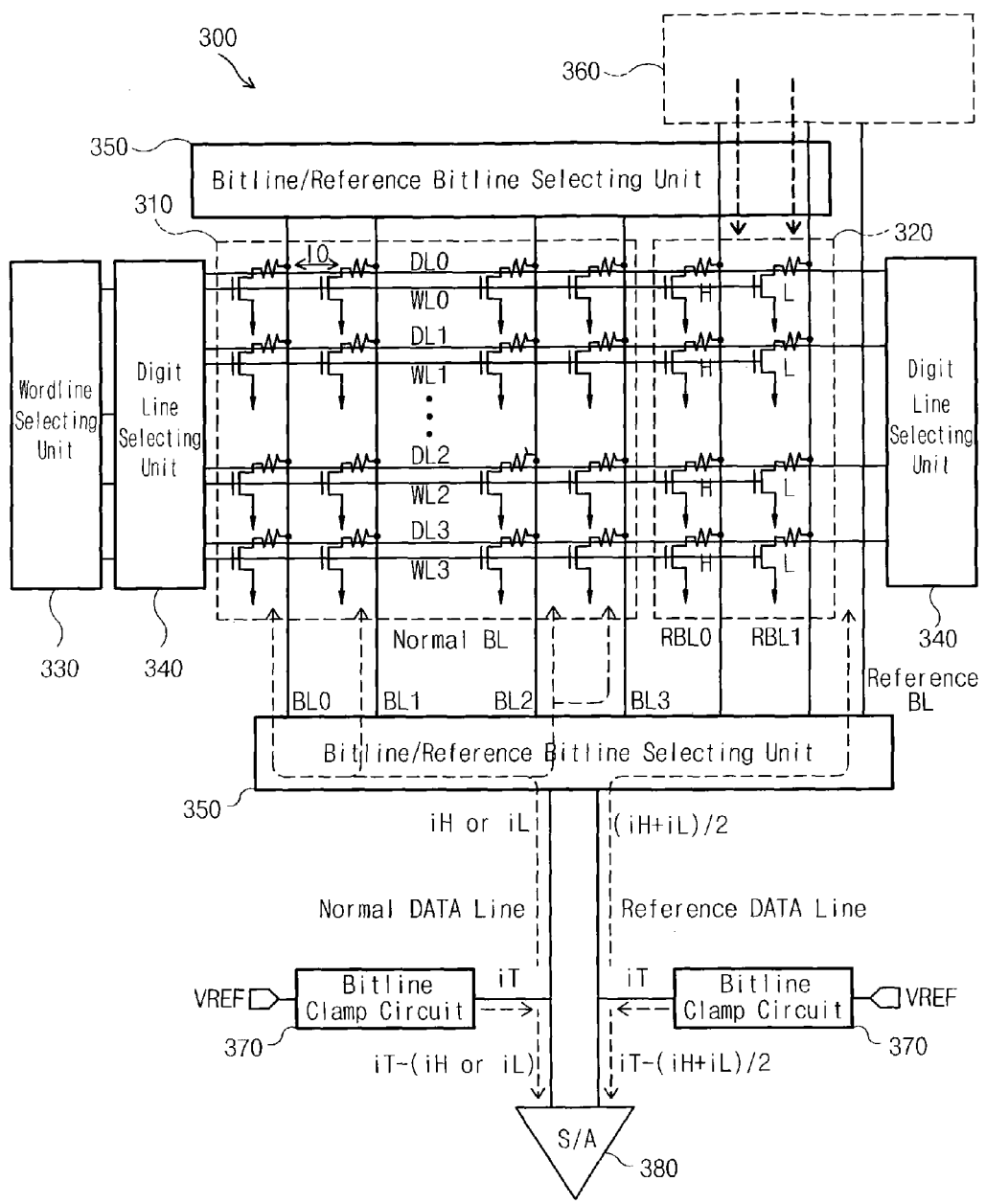
FIG. 3 shows an MRAM device according to an embodiment of the present invention.

Referring to FIG. 3, an MRAM 300 includes a memory array block 310, a reference memory array block 320, a wordline selecting unit 330, a digit line selecting unit 340, a bitline/reference bitline selecting unit 350, a reference current providing unit 360, a bitline clamp circuit 370, and a sense amplifier (S/A) 380. The memory cell array block 310 has magnetic memory cells arranged at intersections of wordlines WL0, WL1, WL2, and WL3 (collectively referred to as "WL"), bitlines BL0, BL1, BL2, and BL3 (collectively referred to as "BL"), and digit lines DL0, DL1, DL2, and DL3 (collectively referred to as "DL"). Magnetic memory cells coupled to a first reference bitline RBL0 are set to a logic high ("H") state, and magnetic memory cells coupled to a second reference bitline RBL1 are set to a logic low ("L") state.

The wordline selecting unit 330 selects one of the wordlines WL, and the bitline selecting unit 350 selects one of the bitlines BL for targeting a cell to be read. Similarly, the digit line selecting unit 340 selects one of the digit lines DL and determines the direction of digit current (ID).

The reference current providing unit 360 is explained in detail with reference to FIG. 4.

Figure 4:
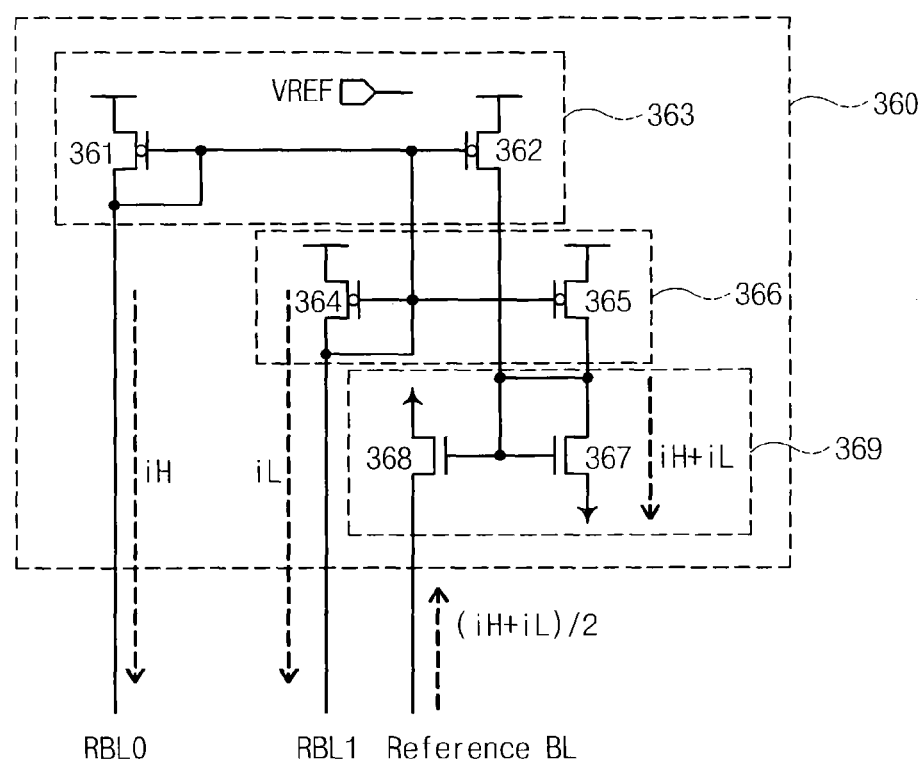
FIG. 4 shows a reference current providing unit of the MRAM device shown in FIG. 3.

Referring to FIG. 4, the reference current providing unit 360 has first to third current mirrors 363, 366, and 369 connected with first and second reference bitlines RBL0 and RBL1 of the reference memory array block 320. A current mirror is a circuit that can produce an output current that mirrors an input current. The output current may remain constant regardless of an actual voltage.

Figure 5:
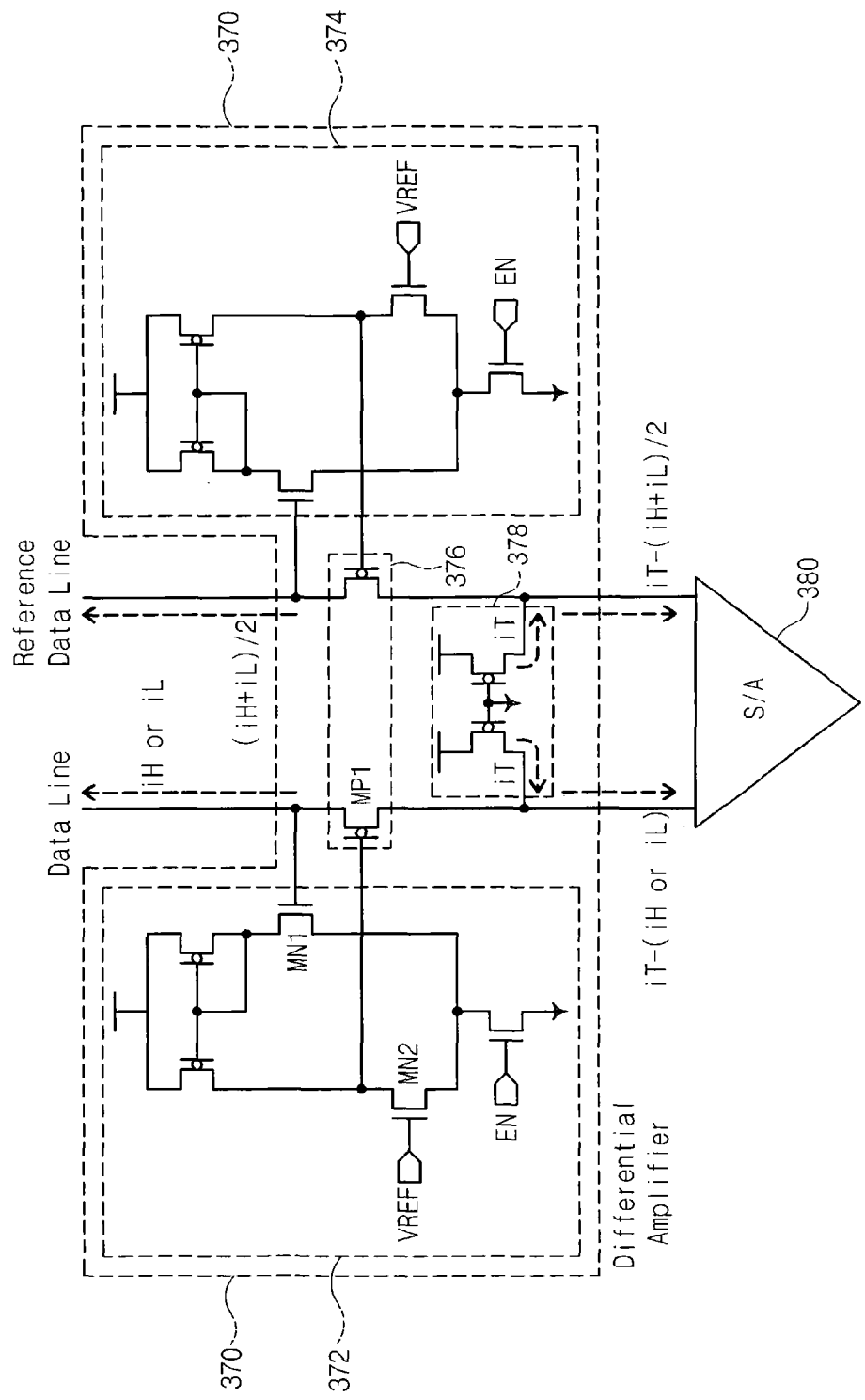
FIG. 5 shows a bitline clamp circuit of the MRAM device shown in FIG. 3.

A first current mirror 363 is coupled to the first reference bitline RBL0. Current i(H) flows to a first transistor 361 of the first current mirror 363 in response to a predetermined bitline clamp voltage VREF, enabling the current i(H) to flow to a second transistor 362. Channel width and length of the first and second transistors 361 and 362 are equal to each other. The second current mirror 366 is coupled to the second reference bitline RBL1. Current i(L) flows to a third transistor 364 in response to the predetermined bitline clamp voltage VREF, enabling the current i(L) to flow to a fourth transistor 365. Channel width and length of the third and fourth transistors 364 and 365 are equal to each other. Current i(H)+i(L) equals the sum current of the current i(H) provided from the second transistor 362 and the current i(L) provided from the fourth transistor 365. The current i(H)+i(L) flows to a fifth transistor 367 of the third current mirror 369. A sixth transistor 368 is set to have half the channel length of the fifth transistor 367, so that current (i(H)+i(L))/2 flows to the sixth transistor 368. Referring to FIG. 5, the current (i(H)+i(L))/2 flowing in the reference current providing unit 360 flows to a reference data line through a reference bitline RBL. Bitline clamp current (iT) provided from the bitline clamp circuit 370 also flows to the reference data line. Thus, current iT−(i(H)+i(L))/2 flows through the reference data line and the reference data line is coupled to a sense amplifier 380. A magnetic memory cell selected in the memory array block 310 is coupled to a data line through a bitline BL. At this time, current flowing through the bitline BL is the current i(H) or i(L) according to a logic state of the selected memory cell. The bitline clamp current (iT) provided from the bitline clamp circuit 370 also flows to the data line, enabling current iT−i(H) or iT−i(L) to flow through the data line.

The sense amplifier 380 senses and amplifies the current flowing through the data line and the reference data line to determine the logic state of the selected magnetic memory cell. While current iT−(i(H)+i(L))/2 flows through the reference data line, the bitline clamp voltage VREF must be high enough to turn on the first to fourth transistors 361, 362, 364, and 365 in the first and second current mirrors 363 and 366. Although the bitline clamp voltage VREF is varied to surpass the transistor turn-on levels, currents flowing through the reference bitline and the reference data line remain constant (i.e., (i(H)+i(L))/2 and iT−(i(H)+i(L))/2, respectively) regardless of the variation of the bitline clamp voltage.

The bitline clamp circuit 370 is coupled between a data line and a reference data line and the sense amplifier (S/A) 380 and includes differential amplifiers 372 and 374, a driving unit 376, and a current providing unit 378. The differential amplifier 372 receives a data line voltage to control the driving unit 376 such that the data line voltage is equivalent to the bitline clamp voltage VREF. This allows the data line and the reference data line, which are precharged to an earth line or ground when a wordline is enabled, to rise up to a voltage level equal to the bitline clamp voltage VREF.

According to the data value of the selected memory cell, current i(H) or i(L) flows to the data line. In addition, constant current iT−(i(H)+i(L))/2 flows to the reference data line without a requiring adjustment to the level of the bitline clamp voltage VREF. As a result, the operation of a sense amplifier 380 of comparing the current iT−i(H) or iT−i(L) of the data line to the current iT−(i(H)+i(L))/2 of the reference data line is more stable and efficient.

Although the illustrative embodiments have been described herein with reference to the accompanying drawings, it is to be understood that the present invention is not limited to these precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A memory device comprising:
   a first memory array having a plurality of first memory cells, wherein each one of the plurality of first memory cells is arranged at an intersection of at least one of a plurality of wordlines, at least one of a plurality of bitlines, and at least one of a plurality of digit lines;
   a second memory array having a plurality of second memory cells, wherein each one of the plurality of second memory cells is arranged at an intersection of at least one of the plurality of wordlines, at least one of a first reference bitline and a second reference bitline of the plurality of bitlines, and at least one of the plurality of digit lines;
   a current providing unit for providing a second current to the first and second reference bitlines in response to a reference voltage; and
   a sense amplifier for comparing a first current flowing through one of the plurality of bitlines with the second current, wherein each one of the plurality of second memory cells set to a first logic state is coupled to the first reference bitline and each one of the plurality of second memory cells set to a second logic state is coupled to the second reference bitline.

2. The memory device of claim 1, wherein the current providing unit comprises:
   a first current mirror coupled to the first reference bitline, wherein a current from the first reference bitline flows through the first current mirror in response to the reference voltage;
   a second current mirror coupled to the second reference bitline, wherein a current from the second reference bitline flows through the second current mirror in response to the reference voltage; and
   a third current mirror for providing half of the sum of the current from the first bitline and the current from the second reference bitline to the sense amplifier.

3. The memory device of claim 1, further comprising a circuit for clamping a voltage of a first data line through which the first current is transmitted, and a voltage of a second data line through which the second current is transmitted, to the reference voltage when one of the plurality of wordlines of one of the plurality of first memory cells is enabled.

4. The memory device of claim 1, wherein the first memory cells and the second memory cells are magnetic.

5. The memory device of claim 1, wherein the first current is a target current.

6. The memory device of claim 1, wherein the second current is defined by the expression (i(H)+i(L))/2.

7. The memory device of claim 1, wherein the second current is a reference current.

8. The memory device of claim 1, wherein the first current is compared to the second current to determine a logic state of a predetermined one of the plurality of first memory cells.

9. A memory device comprising:
   a plurality of first bitlines and a plurality of second bitlines;
   a first memory array having a plurality of first memory cells;
   a second memory array having a plurality of second memory cells;
   a current providing unit for providing a second current to one of the plurality of second bitlines in response to a reference voltage;
   a sense amplifier for comparing a first current flowing through one of the plurality of first bitlines with the second current; and
   a circuit for clamping a voltage of a line through which the first current is transmitted, and a voltage of a line through which the second current is transmitted, to the reference voltage.

10. The memory device of claim 9, wherein the current providing unit comprises:
    a first current mirror coupled to a first one of the plurality of second bitlines;
    a second current mirror coupled to a second one of the plurality of second bitlines; and
    a third current mirror for providing half of the sum of a current from the first current mirror and a current from the second current mirror to the sense amplifier.

11. The memory device of claim 9, wherein each one of the plurality of second memory cells set to a first logic state is coupled to a first one of the plurality of second bitlines and each one of the plurality of second memory cells set to a second logic state is coupled to a second one of the plurality of second bitlines.

12. The memory device of claim 9, wherein the first memory cells and the second memory cells are magnetic.

13. The memory device of claim 9, wherein the first current is a target current.

14. The memory device of claim 9, wherein the second current is defined by the expression (i(H)+i(L))/2.

15. The memory device of claim 9, wherein the second current is a reference current.

16. The memory device of claim 9, wherein the first current is compared to the second current to determine a logic state of a predetermined one of the plurality of first memory cells.

17. A memory device comprising:
    a plurality of bitlines intersecting with a plurality of wordlines and a plurality of digit lines to form a plurality of memory cells;
    a sense amplifier; and a current providing unit electrically coupled to the sense amplifier for providing a reference current to the sense amplifier, wherein:
   the sense amplifier compares a current flowing through a first one of the plurality of bitlines with the reference current; and
   the current providing unit comprises:
      a first current mirror coupled to a second one of the plurality of bitlines;
      a second current mirror coupled to a third one of the plurality of bitlines; and
      a third current mirror for providing the reference current equal to half of the sum of a current from the first current mirror and a current from the second current mirror to the sense amplifier.

18. A memory device comprising:
a first memory array having a plurality of memory cells connected with one of a plurality of wordlines, wherein each one of the memory cells stores either one of a first logic state and a second logic state;
a second memory array having a plurality of first reference memory cells set to the first logic state and a plurality of second reference memory cells set to the second logic state, wherein the first and second reference memory cells are connected with one of the plurality of wordlines;
a circuit for clamping a voltage of a first data line through which a first current is transmitted to a selected memory cell, and a voltage of a second data line through which a second current is transmitted to the first and second reference memory cells, to a reference voltage when one of the plurality of word lines of one of the plurality of memory cells is enabled;
a reference current providing unit for providing a first reference current and a second reference current to the first reference memory cells and the second reference memory cells respectively, in response to the reference voltage, wherein an average of the first and second reference currents is the same as the second current; and
a sense amplifier for sensing the logic state of a selected memory cell by comparing the first current with the second current.

* * * * *